(12) United States Patent
Hutchison

(10) Patent No.: US 7,583,075 B1
(45) Date of Patent: Sep. 1, 2009

(54) SUBTRACTIVE CURRENT MEASURING METHOD

(75) Inventor: Hugh G. Hutchison, Rugby (GB)

(73) Assignees: Geist Manufacturing, Inc., Lincoln, NE (US); Aphel, Ltd., West Midlands (GB)

( * ) Notice: Subject to any disclaimer, the term of this patent is extended or adjusted under 35 U.S.C. 154(b) by 0 days.

(21) Appl. No.: 11/633,753

(22) Filed: Dec. 5, 2006

(51) Int. Cl.
*G01R 15/18* (2006.01)

(52) U.S. Cl. .................................. 324/127; 324/126

(58) Field of Classification Search ............... None
See application file for complete search history.

(56) References Cited

U.S. PATENT DOCUMENTS

| | | | | |
|---|---|---|---|---|
| 4,314,200 A | * | 2/1982 | Marek | 324/117 R |
| 5,594,332 A | * | 1/1997 | Harman et al. | 324/127 |
| 5,986,860 A | * | 11/1999 | Scott | 361/42 |
| 6,081,109 A | * | 6/2000 | Seymour et al. | 324/127 |
| 6,184,672 B1 | * | 2/2001 | Berkcan | 324/117 R |
| 6,608,741 B1 | * | 8/2003 | Macbeth | 361/42 |

\* cited by examiner

*Primary Examiner*—Paresh Patel
(74) *Attorney, Agent, or Firm*—Suiter Swantz pc llo

(57) ABSTRACT

The present invention is a subtractive current measuring system for a power receptacle. The system may comprise one or more of the following features: (a) a power receptacle; (b) a current carrying input wire; (c) a current carrying output wire; (d) a current transformer; (e) an electrical measuring device; and (f) interconnecting circuitry linking the current transformer and the electrical measuring device.

6 Claims, 5 Drawing Sheets

SUBTRACTIVE CURRENT MEASURING METHOD

FIELD OF THE INVENTION

The present invention generally relates to the field of current transformers, and more particularly to an apparatus and method using a current transformer to measure current in a circuit.

BACKGROUND OF THE INVENTION

The measurement of current flowing into and out of individual power outlets is a common feature of today's electrical wiring systems. This measurement may be accomplished using a current transformer. A current transformer is designed to produce either an alternating current or alternating voltage proportional to the current being measured. Referring to FIG. 1, a current transformer 100 common to the art is presented. Current transformers are often constructed by passing a single primary wire 101 (the primary turn) through a well-insulated toroidal core 102 wrapped with multiple turns of a transformer wire 103 (the secondary turns). The toroidal core 102 may be composed of ferrous materials such as iron, silicon steel, carbonyl iron or other such materials common in the art.

Current transformers are commonly used in metering and protective relaying in the electrical power industry where they facilitate the safe measurement of large currents, often in the presence of high voltages. The current transformer safely isolates measurement and control circuitry from the high voltages typically present on the circuit being measured.

The current transformer 100 utilizes the electromagnetic radiation emitted from the primary wire 101 as current flows in the wire 101. The electromagnetic radiation from the primary wire 101 induces a magnetic flux in the toroidal core 102. Based on Maxwell's Law, the current transformer 100 converts part of the electromagnetic field (EMF) produced by the primary current $I_p$ 106 flowing in the primary wire 101 to a corresponding secondary transformer current $I_t$ 107 in the transformer wire 103. The output of the current transformer may be placed across a load resistor 104 for measurement by a electrical measuring device 105. The accuracy of a current transformer is typically about 5%.

The current in the transformer wire 103 is in direct proportion (as specified by the number of turns in the transformer wire 103) to that of the primary wire 101. This relationship is governed by the Equation 1:

$$I_p = I_t \left( \frac{N_t}{N_p} \right) \quad \text{(Equation 1)}$$

where $I_p$ is the current flowing through the primary wire 101, $I_t$ is the current flowing through the transformer wire 103, $N_p$ is the number of turns in the primary wire 101 and $N_t$ is the number of turns in the transformer wire 101. In most cases, the denominator $N_p$ may be disregarded as the number of turns in the primary wire is one (1) (i.e. the single pass of the primary wire through the current transformer). As such, once the current in the transformer wire 103 is measured via the measuring device 105, the current in the primary wire 101 may be calculated knowing the respective turns of the primary wire 101 and the transformer wire 103.

In power strip applications where many receptacles are to be monitored, multiple current transformers may be used. Referring to FIG. 2, a power strip wiring schematic 200 common to the art is presented. Power strips commonly incorporate numerous receptacles 201, 202 wired in series. The receptacles may be capable of receiving a connection cable for a given load such as a computer, lamp, or other electrical device. Current carrying live wires 203, 204, and 205 and neutral wires 206, 207, and 209 are connected to screw terminals 209 linking the respective receptacles together.

Current measurement for an individual power receptacle normally requires the use of two current transformers. A common method of monitoring the amount of current directed to a load connected to a power receptacle 201 is to place a current transformer 210 on an incoming live wire 203 and another current transformer 211 on the outgoing live wire 204 from the receptacle 201. The outputs of the current transformers 210 and 211 may be routed to separate load resistors 212 for conversion to an associated voltage. These resultant voltages may then be routed to amplifiers 213 to enhance the signals. The outputs of the amplifiers 213 may then be transmitted to subtraction circuitry 214. The resulting output value 215 corresponds to the amount of current directed to the load connected to the power receptacle 201. If the output value 215 should rise above a specified threshold value (indicating a short in a given load), the subject receptacle may be disabled to prevent damage to the circuit or harm to persons using the system.

Numerous drawbacks exist with respect to such a configuration. For example, two current transformers are required for each power receptacle. Also, each current transformer has a +/−5% accuracy. As such, the use of two current transformers for each receptacle results in a +/−10% accuracy in current measurement. Separate wiring for multiple amplifier and subtraction circuits may also be necessary thereby increasing complexity and cost of the system.

As such, it would be desirable to provide a current measuring system and method incorporating only one current transformer for each power receptacle to be monitored.

SUMMARY OF THE INVENTION

Accordingly, the present invention is directed to a subtractive current monitoring system and method.

In an embodiment of the invention, a system for monitoring current may comprise: (a) a power receptacle; (b) a current carrying input wire; (c) a current carrying output wire; (d) a current transformer; (e) an electrical measuring device; and (f) interconnecting circuitry linking the current transformer and the electrical measuring device.

In a further embodiment of the invention, a method for monitoring current levels in a power receptacle may comprise: (a) connecting a current carrying input wire and a current carrying output wire to a power receptacle; (b) routing the current carrying input wire and the current carrying output wire through a wire-wrapped, toroidal-core current transformer; and (c) configuring the portions of the current carrying input wire and the current carrying output wire disposed within the plane defined by the current transformer such that the current carrying output wire cancels a portion of the electromagnetic field of the current carrying input wire.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made, in detail, to presently preferred embodiments of the invention, an example of which is illustrated in the accompanying drawings.

Figure 3:
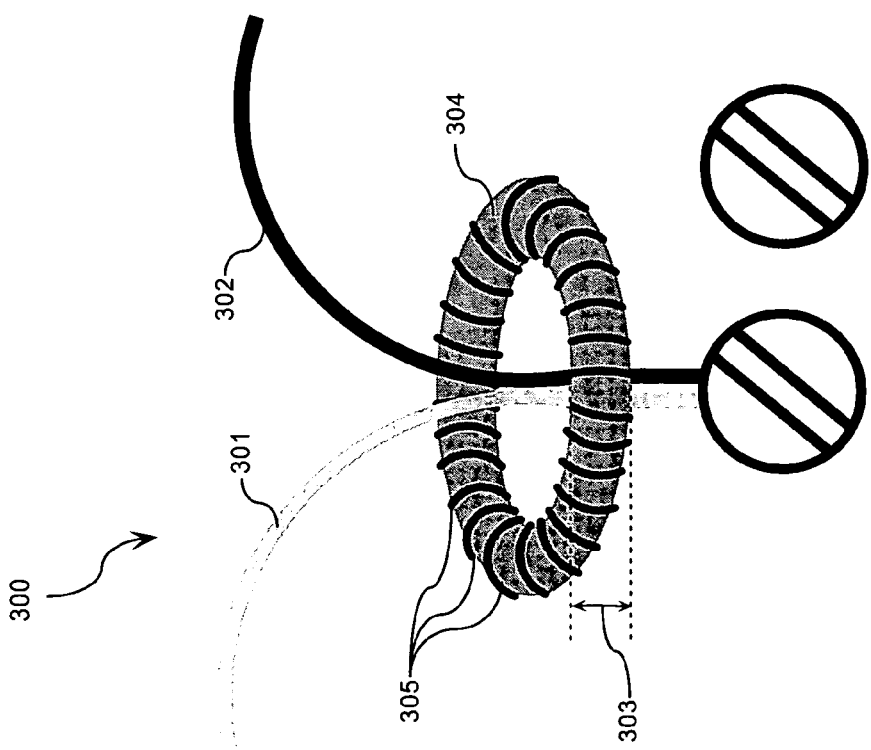
FIG. 3 depicts a current transformer in accordance with an embodiment of the present invention.

Referring to FIG. 3, a system for measuring current in accordance with an embodiment of the present invention is disclosed. The system 300 incorporates a current carrying input wire 301 and an output current carrying wire 302 as the elements of the subtraction mechanism. The current carrying input wire 301 and current carrying output wire 302 may be live wires or neutral wires of a given circuit. The input wire 301 and output wire 302 may become parallel for a distance of at least the thickness 303 of the plane defined by the toroidal core 304. As such, the electromagnetic field (EMF) of the output wire 302 will cancel a portion of the EMF of the input wire 301. As the degree of EMF cancellation is a function of the proximity of the input wire 301 and the output wire 302, it is preferable that the input wire 301 and output wire 302 are maintained in physical contact along their mutually parallel section. Such contact may be maintained by utilizing wire tie-wraps or bi-directional two-wire cables. The resultant EMF is transmitted to the toroidal core 304 thereby inducing a measurable current in the wrapped wires 305. This induced current will correspond to current being directed to the load connected to the associated power receptacle.

Figure 1:
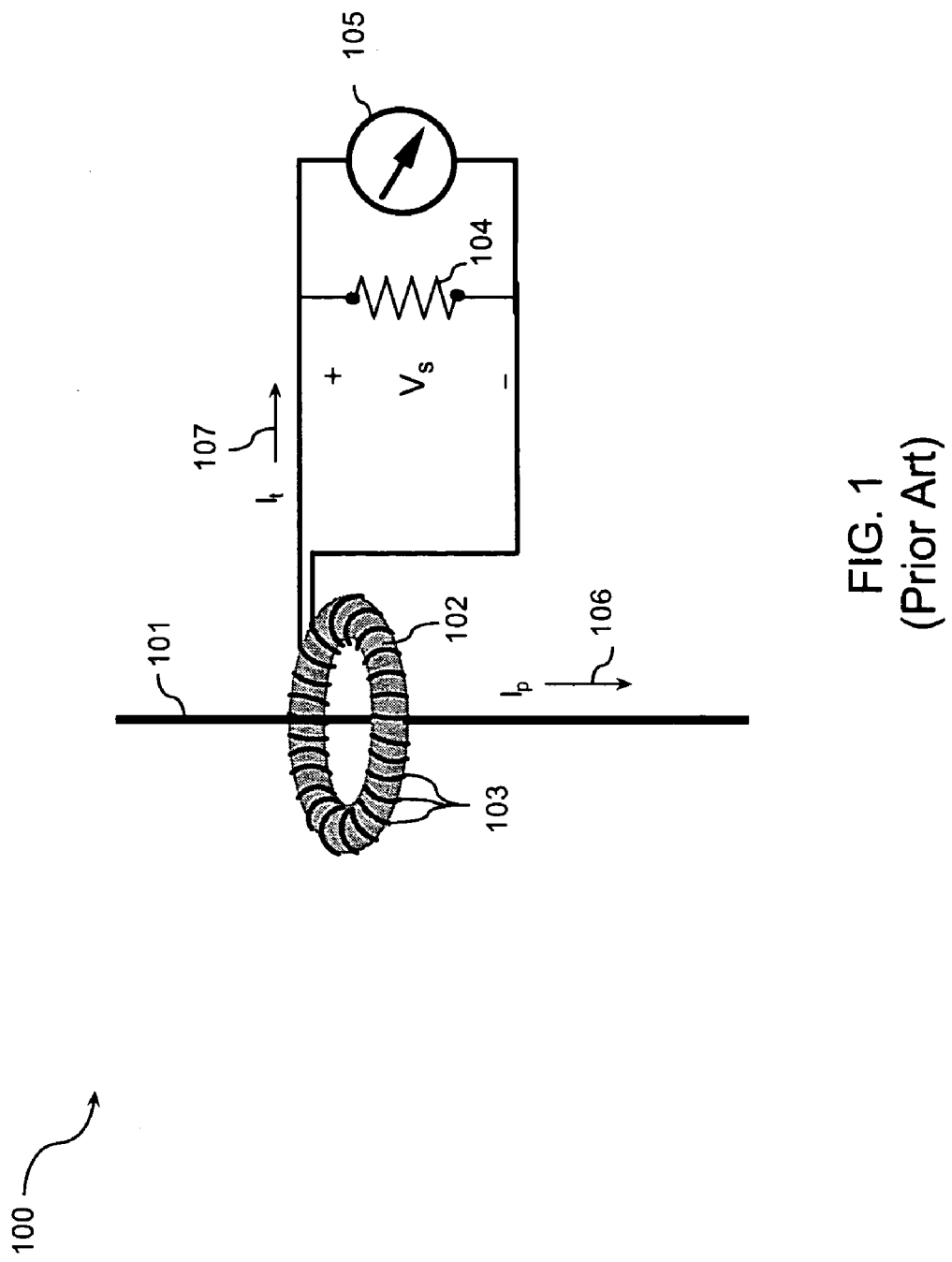
FIG. 1 depicts a current transformer common to the art.
Figure 2:
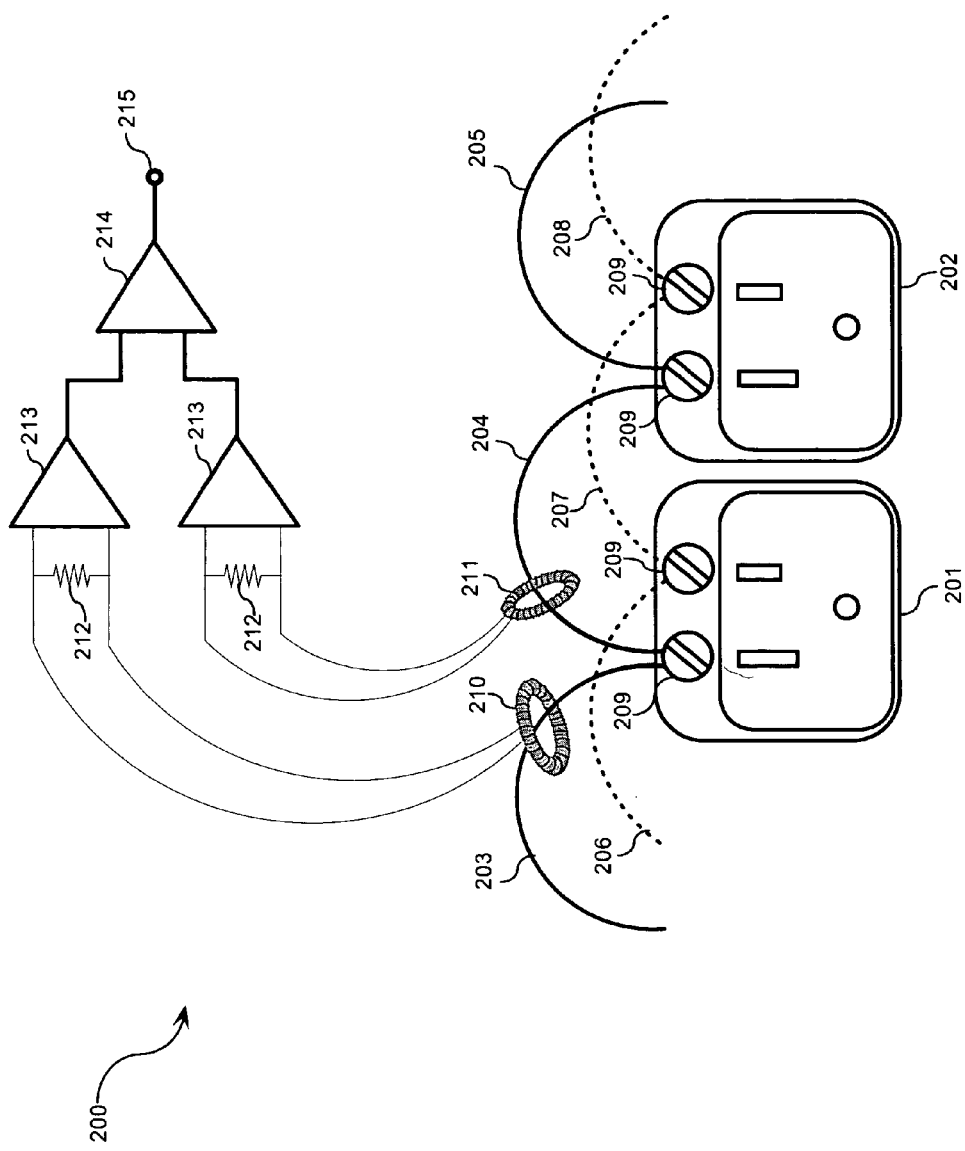
FIG. 2 depicts a power strip wiring schematic common to the art.
Figure 4:
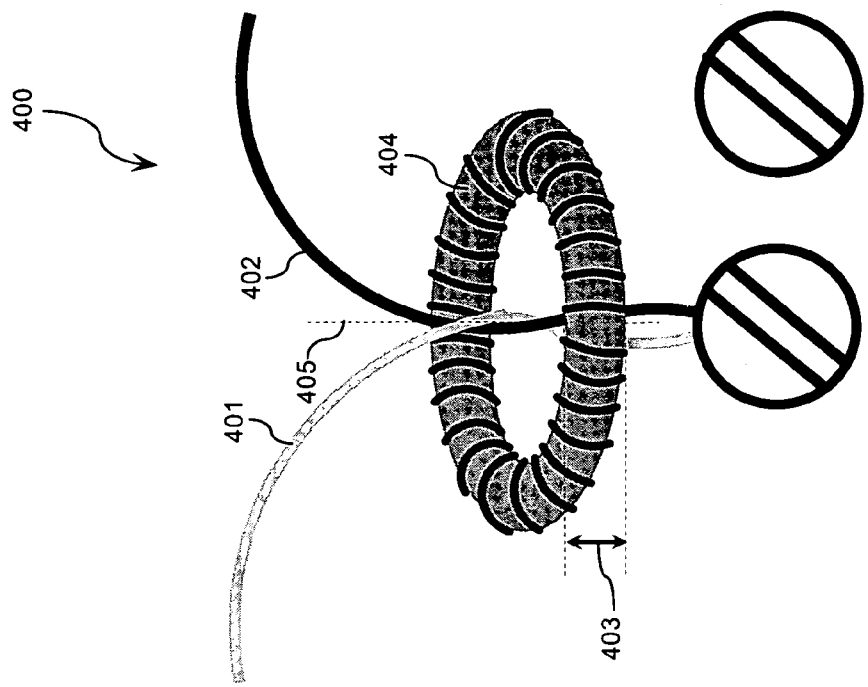
FIG. 4 depicts a current transformer in accordance with an embodiment of the present invention.

Referring to FIG. 4, a system for measuring current in accordance with an embodiment of the present invention is disclosed. The system 400 incorporates a current carrying input wire 401 and an output current carrying wire 402 as the elements of the subtraction mechanism. The current carrying input wire 401 and current carrying output wire 402 may be live wires or neutral wires of a given circuit. The input wire 401 and output wire 402 may become parallel for a distance of at least the thickness 403 of the plane defined by the toroidal core 404. As referenced above, the degree of EMF cancellation is a function of the proximity of the input wire 401 and the output wire 402. Therefore, it is preferable to configure the input wire 401 and output wire 402 such that they are intertwined around each other along an axis 405 perpendicular to the plane defined by the toroidal core 404, thereby maintaining the electromagnetic coupling without the need of additional connection materials.

Figure 5:
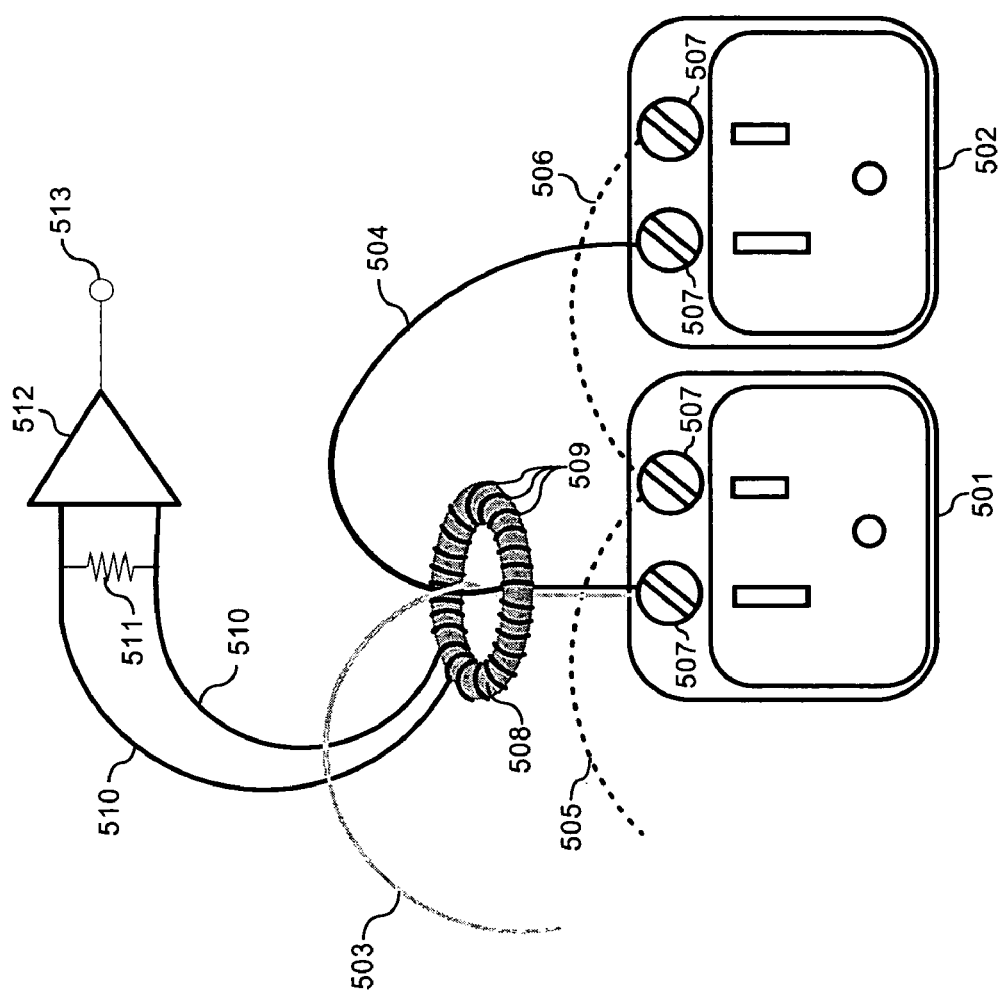
FIG. 5 depicts a plurality of power strip receptacles in accordance with an embodiment of the present invention.

Referring to FIG. 5, a power strip 500 comprising two or more power receptacles 501, 502 employing the inventive current transformer configuration in an embodiment of the present in invention is disclosed. The power receptacles 501 and 502 may be wired in series. The receptacles may be capable of receiving a connection cable for a given load such as a computer, lamp, or other electrical device. Current carrying live wires 503, 504 and neutral wires 505, 506 are connected to screw terminals 507 linking the respective receptacles 501, 502.

A current carrying live input wire 503 and a current carrying live output wire 504 (with respect to receptacle 501) may each be routed through the open space disposed in a toroidal core 508. The input wire 503 and output wire 504 may become parallel for a distance of at least the thickness of the toroidal core 508. As such, the electromagnetic field (EMF) of the output wire 504 may cancel a portion of the EMF of the input wire 503. The resultant EMF will be transmitted to the toroidal core 508 thereby inducing a measurable current in the wrapped wires 509. This induced current will correspond to the amount of current directed to the load connected to the power receptacle 501.

The external portions 510 of the wrapped wires 509 may be routed to a load resistor 511 for conversion to an associated voltage. This resultant voltage may be routed to an amplifier 512. The resulting output value 513 corresponds to the amount of current directed to the load connected to the power receptacle 501.

Figure 6:
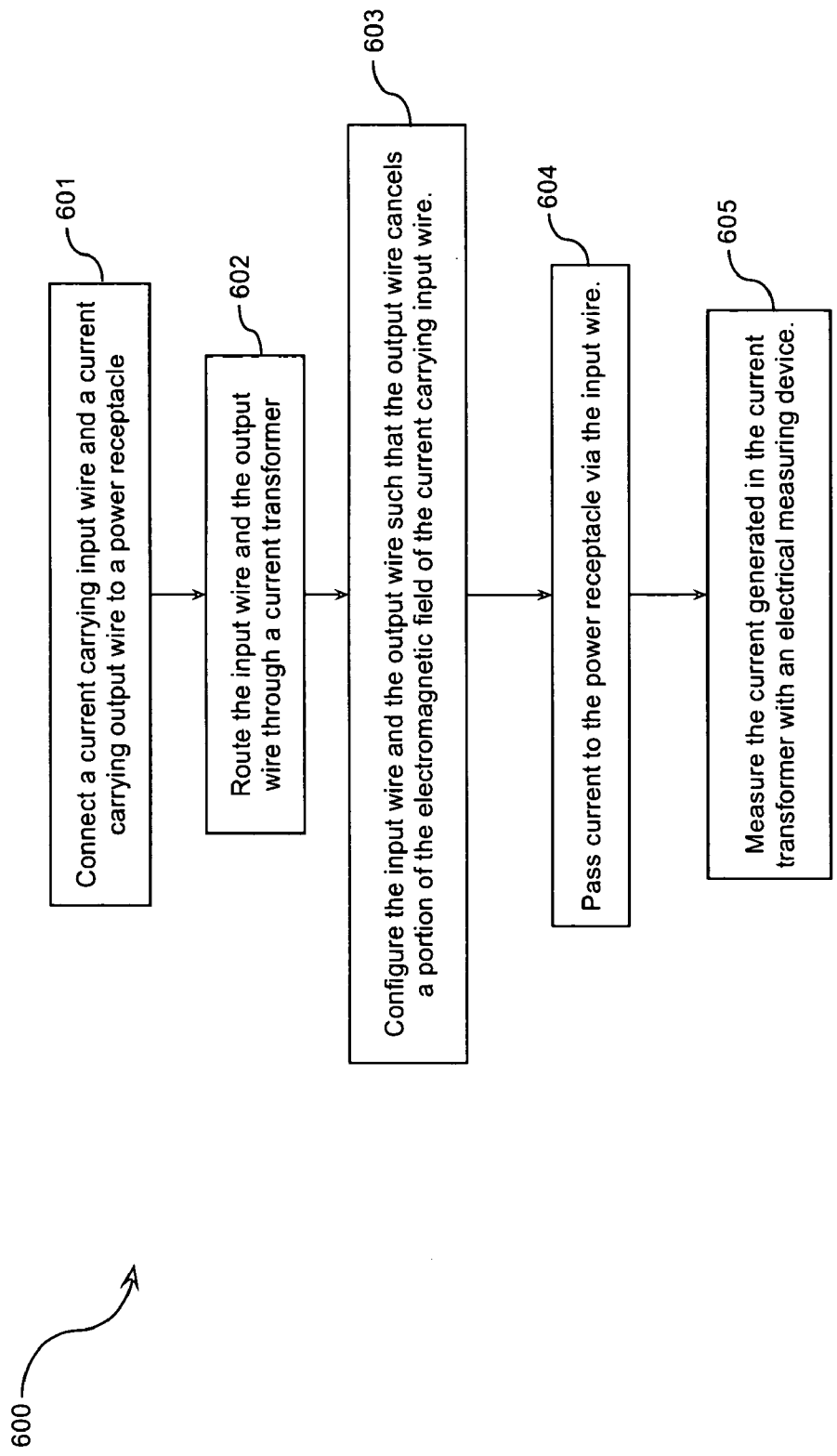
FIG. 6 depicts a process flowchart detailing a method of manufacturing a current monitoring system in accordance with an embodiment of the present invention.

Referring to FIG. 6, a process flowchart detailing a method for monitoring the current flow of a power receptacle 600 in accordance with an embodiment of the present invention is disclosed. A current carrying input wire and a current carrying output wire are connected to a power receptacle at state 601. The input and output wires may be connected utilizing screw terminals or other connection mechanisms common to the art. The input and output wires may serve as connections to one or more other power receptacles in series, as in a power strip.

The input and output wires may be routed through a current transformer at state 602. The current transformer may comprise a wire-wrapped toroidal core having an open-space disposed within the toroidal core. A portion of both the input and output wires are brought into close proximity such that the output wire cancels a portion of the electromagnetic field (EMF) of the input wire at state 603. The portions of the input and output wires which are proximately located are disposed within the open-space of the toroidal core.

Current is passed through the input and output wires in order to power a load connected to the power receptacle at state 604. Together, these currents may impart a resultant EMF on the toroidal core, thereby generating an associated current flow in the wire which surrounds the toroidal core of the current transformer. As the proximately located input and output wires operate as an EMF subtraction circuit (i.e. $EMF_{input} - EMF_{output} = EMF_{resultant}$), the associated current in the current transformer will be proportional to the current flowing through the load attached to the power receptacle.

The current generated in the current transformer may be measured by an electrical measuring device such as a voltmeter, ammeter or other device common to the art at state 605. Knowledge of the number of windings in the wire-wrapping of the current transformer allows for the calculation of the ratio governing the relationship between the measured current and the current directed to the load connected to a power receptacle, per Equation 1. A given measured transformer current ($I_t$) will equate to a specific load current ($I_L = I_{input\ wire} - I_{output\ wire}$) being passed to the load connected to a given receptacle, thereby allowing for the monitoring of the load current level.

For example, with a measured current of 5 amps and a transformer-to-primary turns ratio of 100:1 (i.e. the current transformer has 100 turns and measured wire has 1 turn), Equation 1 would yield:

$$I_L = I_t\left(\frac{N_t}{N_L}\right)$$ (Equation 1)

$$I_L = (5 \text{ amps})\left(\frac{100 \text{ turns}}{1 \text{ turn}}\right)$$

$I_L$=500 amps (±5%)

It is believed that the present invention and many of its attendant advantages will be understood from the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for monitoring current levels in a power receptacle, the method comprising the steps:

connecting a current carrying input wire, a terminal of a power receptacle and a current carrying output wire in series;

routing the current carrying input wire and the current carrying output wire through a wire-wrapped, toroidal-core current transformer; and configuring portions of the current carrying input wire and the current carrying output wire disposed within a plane defined by the current transformer such that the current carrying output wire cancels a portion of the electromagnetic field of the current carrying input wire;

passing a current through the current carrying input wire; and measuring a current generated in the current transformer by the resultant electromagnetic field of the current carrying input wire and the current carrying output wire disposed within the free-space void in the toroidal core.

2. The method of claim 1, further comprising the step:

connecting two or more power receptacles in series via the current carrying input wire and the current carrying output wire.

3. The method of claim 1, wherein the step of configuring the portions of the current carrying input wire and the current carrying output wire comprises the step:

physically coupling the current carrying input wire and the current carrying output wire.

4. The method of claim 3, wherein the step of physically coupling the current carrying input wire and the current carrying output wire comprises the step:

intertwining of the current carrying input wire and the current carrying output wire.

5. The method of claim 3, wherein the step of physically coupling the current carrying input wire and the current carrying output wire comprises the step:

disposing the current carrying input wire and the current carrying output wire within conjoined insulating conduits.

6. The method of claim 1, wherein the portions of the current carrying input wire and the current carrying output wire disposed within the plane are aligned along an axis perpendicular to the plane.

* * * * *